(12) United States Patent
Fedorov et al.

(10) Patent No.: US 9,245,722 B2
(45) Date of Patent: Jan. 26, 2016

(54) SMS PROBE AND SEM IMAGING SYSTEM AND METHODS OF USE

(71) Applicant: Georgia Tech Research Corporation, Atlanta, GA (US)

(72) Inventors: Andrei G. Fedorov, Atlanta, GA (US); Peter Arthur Kottke, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 14/483,204

(22) Filed: Sep. 11, 2014

(65) Prior Publication Data

US 2015/0076339 A1    Mar. 19, 2015

Related U.S. Application Data

(60) Provisional application No. 61/878,225, filed on Sep. 16, 2013.

(51) Int. Cl.
*H01J 49/04* (2006.01)
*H01J 49/00* (2006.01)
*H01J 37/28* (2006.01)

(52) U.S. Cl.
CPC .............. *H01J 49/0431* (2013.01); *H01J 37/28* (2013.01); *H01J 49/0004* (2013.01); *H01J 2237/05* (2013.01); *H01J 2237/2803* (2013.01); *H01J 2237/285* (2013.01); *H01J 2237/2809* (2013.01)

(58) Field of Classification Search
CPC .............. H01J 49/0431; H01J 49/0468; H01J 49/0031; H01J 37/28; H01J 2237/05
See application file for complete search history.

(56) References Cited

U.S. PATENT DOCUMENTS

| | | | | |
|---|---|---|---|---|
| 3,660,655 A * | 5/1972 | Wardell | .................. | H01J 49/14 250/281 |
| 4,132,892 A * | 1/1979 | Wittmaack | ............ | H01J 37/256 250/292 |
| 5,376,791 A * | 12/1994 | Swanson | ............. | H01J 37/3056 250/307 |
| 6,002,128 A * | 12/1999 | Hill | ........................ | H01J 37/256 250/281 |
| 6,124,142 A * | 9/2000 | Fujino | ..................... | H01L 22/12 257/E21.53 |
| 6,414,307 B1 * | 7/2002 | Gerlach | ............... | G01N 23/225 280/307 |
| 7,015,463 B2 * | 3/2006 | Cotter | .................... | B82Y 15/00 250/281 |
| 7,358,491 B2 * | 4/2008 | Bloeβ | ..................... | H01L 22/12 250/307 |
| 2002/0017619 A1 * | 2/2002 | Hirose | ................ | H01J 37/3005 250/492.3 |
| 2003/0124595 A1 * | 7/2003 | Lizardi | ............. | G01N 33/5306 435/6.14 |
| 2005/0236564 A1 * | 10/2005 | Keller | ................ | H01J 49/0413 250/288 |
| 2008/0210854 A1 * | 9/2008 | Jindai | ................ | G06F 11/0721 250/281 |
| 2010/0193681 A1 * | 8/2010 | Vestal | ....................... | H01J 3/14 250/287 |
| 2011/0049350 A1 * | 3/2011 | Vestal | ..................... | H01J 49/40 250/282 |
| 2011/0155901 A1 * | 6/2011 | Vestal | ................ | H01J 49/0072 250/282 |
| 2011/0266431 A1 * | 11/2011 | Vestal | ................ | H01J 49/0045 250/282 |
| 2012/0025074 A1 * | 2/2012 | Barbi | .................... | G01T 1/2018 250/307 |

* cited by examiner

*Primary Examiner* — Nicole Ippolito
*Assistant Examiner* — Sean Luck
(74) *Attorney, Agent, or Firm* — Thomas | Horstemeyer, LLP

(57) ABSTRACT

SMS probe imaging systems, methods of use thereof, and the like are disclosed. Embodiments of the present disclosure can use direct interrogation of objects (e.g., cells or tissue) within a small pool/droplet of liquid, optional thermal, mechanical, electrical, optical and chemical manipulation, followed immediately by liquid sampling, optional sample conditioning, and soft ionization of biomolecules.

23 Claims, 12 Drawing Sheets

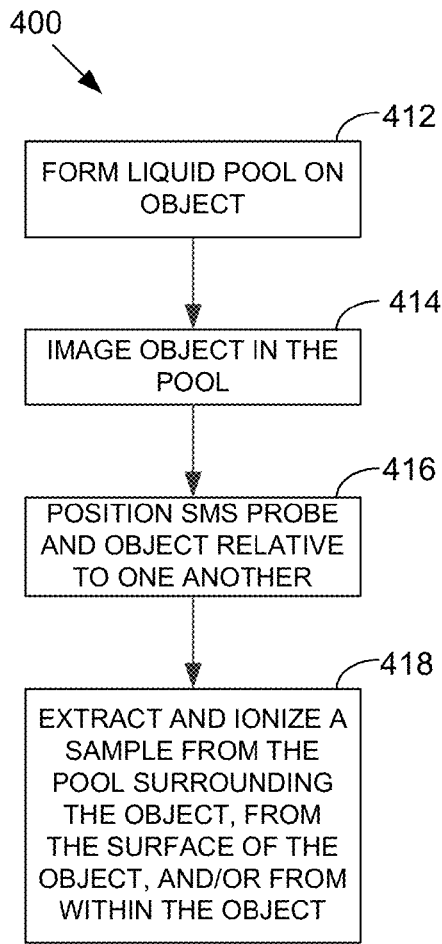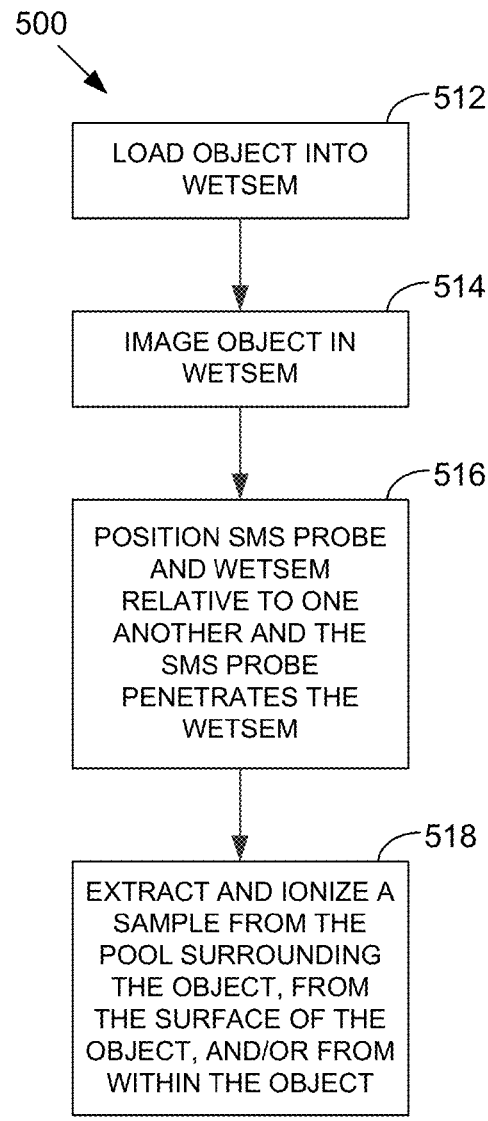
FIG. 5
FIG. 6

SMS PROBE AND SEM IMAGING SYSTEM AND METHODS OF USE

CROSS-REFERENCE TO RELATED APPLICATION

This application claims priority to U.S. provisional application entitled "ESEM-SMS Probe and Imaging System for In-Vitro Cell Dynamics," having Ser. No. 61/878,225 filed on Sep. 16, 2013, which is entirely incorporated herein by reference.

FEDERAL SPONSORSHIP

This invention was made with Government support under Contract/Grant No. R21 GM103539, awarded by National Institutes of Health (NIH). The Government has certain rights in this invention.

BACKGROUND

The capability to monitor the spatially-resolved biochemical activity of an individual biological cell on the time scale of physiologically-relevant processes in an aqueous, i.e., natural, environment, with minimum alteration of the cell's biochemical state would provide enhanced insight into the biological underpinnings of the cell's biochemical cycle and mechanism(s) of disease progression on the most basic molecular level. However, currently technology does not provide for such capabilities.

SUMMARY

SMS probe imaging systems, methods of use thereof, and the like are disclosed. Embodiments of the present disclosure can use direct interrogation of objects (e.g., cells or tissue) within a small pool/droplet of liquid, optional thermal, mechanical, electrical, optical and chemical manipulation, followed immediately by liquid sampling, optional sample conditioning, and soft ionization of biomolecules.

One exemplary method, among others, includes: imaging an object in a system to produce an object image; positioning an SMS probe and the object relative to one another at a first position using the object image; extracting a sample in the first position using the SMS probe, wherein the sample includes one or more components; and ionizing one or more of the components. In an embodiment, the method can also include: forming a pool of a liquid on the object; wherein positioning includes positioning the SMS probe and the pool relative to one another, and wherein extracting includes extracting the sample from: the pool around the object, the surface of the object, within the object, or a combination thereof. In an embodiment, the method also includes: delivering a solvent or agent to the object. In an embodiment, the method includes: forming a second pool of a liquid on the object; positioning the SMS probe and the second position relative to one another; extracting a sample from the second pool using the SMS probe, wherein the sample includes one or more components; and ionizing one or more of the components. In an embodiment, the method includes: a sealed compartment having a thin film disposed over a compartment, wherein the compartment includes the object and a pool of liquid on the object, wherein positioning includes contacting the SMS probe with the thin film so that the SMS probe penetrates the thin film, and wherein extracting includes extracting a sample from the pool using the SMS probe. In an embodiment, the method includes: extracting includes extracting a sample of the fluid, and analyzing includes analyzing the sample using system selected from the group consisting of: an electrospray ionization mass spectrometer system, a desorption electrospray ionization mass spectrometer system, a matrix assisted laser desorption ionization mass spectrometer system, antibody-antigen assays, gene microarrays, electrochemical biosensors, IR and Raman spectroscopy, and Nano/MicroElectroMechanical System (NEMS/MEMS) sensors.

One exemplary system, among others, includes: a scanning electron microscopy system for imaging an object to form an object image, a SMS probe to extract and ionize a sample from the object, and a stage, wherein the object is disposed on the stage, wherein the SMS probe, the stage, or a combination thereof are positioned using the object image so that the SMS probe is able to obtain a sample relevant to an object. In an embodiment, the system includes a mass spectrometry system interfaced with the SMS probe. In an embodiment, the system includes a low vacuum chamber surrounding the stage and the SMS probe, wherein the pressure in the low vacuum chamber is about 5 to 10 torr, wherein the temperature inside the low vacuum chamber is about $-40°$ C. to $11°$ C. In an embodiment, the object is in a sealed compartment, wherein the pressure in the sealed compartment is about 0.1 to 2 atm, and wherein the temperature inside the sealed compartment is about $20°$ C. to $40°$ C. In an embodiment, the system includes a pool forming system used to form a pool of a liquid on the object. In an embodiment, the system includes a solvent/agent delivery system used to deliver a solvent or agent to the droplet.

Other systems, methods, features, and advantages of this disclosure will be or become apparent to one with skill in the art upon examination of the following drawings and detailed description. It is intended that all such additional systems, methods, features, and advantages be included within this description, be within the scope of this disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

FIG. 5 is a flow chart illustrating a method of using a SMS probe imaging system that is in the ESEM mode.

FIG. 6 is a flow chart illustrating a method of using a SMS probe imaging system that is in the sealed compartment mode.

FIG. 14 illustrates some elements: (a) Sample—can be dynamic and spatially heterogeneous, (b) Sampling capillary—used for sample extraction and ionization, (c) Barrier—separates liquid sample from spray chamber, (d) Spray atmosphere—can include assist flow, drying gas, and variable pressure control, and (e) counter electrode/ion transport tube.

DETAILED DESCRIPTION

Figure 1:
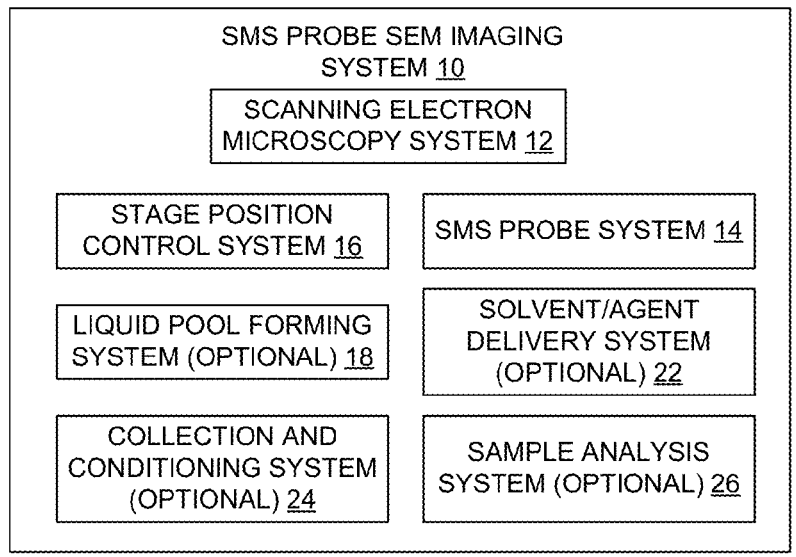
FIG. 1 is a block diagram illustrating an embodiment of the SMS probe SEM imaging system.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of analytical chemistry, imaging, biotechnology, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Discussion:

SMS probe imaging systems, SMS probes, methods of use thereof, and the like are disclosed. Embodiments of the present disclosure can use direct interrogation of objects (e.g., cells or tissue) within a small pool/droplet of liquid, optional thermal, mechanical, electrical, optical and chemical manipulation, followed immediately by liquid sampling, optional sample conditioning, and soft ionization of biomolecules.

Embodiments of the SMS probe imaging system allow for in-vitro imaging of transient events at submerged interfaces in solution. Embodiments of the present disclosure provide for an imaging system that can have considerable general applicability as a basic tool for discovery-based biomedical research, including new biological hypotheses generation and molecular-level medicine validation that is: 1) minimally-disturbing, fully-passive imaging in solution (including live cultures in media and submerged biologically-active interfaces); 2) truly quantitative imaging capability; and, 3) real time monitoring of in situ biochemical processes in extra- and intra-cellular environments (e.g., in the nucleus or in organelles) on the scale of an individual cell and below. In an embodiment, sub-cellular level resolution (e.g., about 100 nm to 1 μm) and sub-second temporal resolution (e.g., 0.1 to 10 ms) can be achieved. Embodiments of modes of operation include (1) for transient mode operation, including scanning mode operation, (2) for ultra-high resolution (sub-micrometer) spot imaging of flash frozen tissue and culture samples, and (3) for transient monitoring of secretions from cultures within sealed capsules.

An embodiment of the SMS probe imaging system can include a combination of (i) the capability to establish and maintain a controlled liquid environment within an SEM (e.g., environmental electron microscopy) and (ii) solution-based soft electrospray ionization mass spectrometry performed in situ and passively (no active fluid pumping).

After the SMS probe system is described in general, additional details will be provided regarding specifics of the SMS probe system 14. FIG. 1 is a block diagram illustrating an embodiment of the SMS probe SEM imaging system 10 (also referred to as the "SMS probe imaging system"). An embodiment of the SMS probe imaging system 10 can include a scanning electron microscopy system 12, a SMS probe system 14, a stage position control system 16, optionally, a liquid pool forming system 18, optionally, a solvent/agent delivery system 22, optionally, a collection and conditioning system 24, and optionally, a sample analysis system 26. In addition, the SMS probe imaging system can include a computer(s) system that can be in communication with one or more components of the SMS probe imaging system 10 and/or in communication with computers that operate one or more of the components of the SMS probe imaging system 10. In an embodiment, the computer system can be used to acquire various data such as each position of the SMS probe and the object relative to one another, a chemical analysis of the sample at each position, and a combination thereof.

In particular, embodiments of the present disclosure can include an ESEM-SMS (Environmental Scanning Electron Microscopy—Scanning Mass Spectrometry) probe imaging system or an SMS probe sealed capsule imaging system, each of which are described below and in the Examples in more detail.

The object can include, but is not limited to, a biological sample (e.g., cells, tissue constructs, DNA/protein microarrays, and the like), a chemical sample (e.g., catalysts, ionic liquids, and the like), and combinations thereof. As mentioned above, a pool of liquid is disposed on the object and the liquid can be sampled at a distance from the sample or adjacent the surface of the object (e.g., cell membrane), or inside the object can be sampled by the SMS probe system. Reference to acquiring a sample "from the object" can include any of sampling a distance from the sample or adjacent to or from within the surface of the object, or inside the object.

The SMS probe system 14 can include an SMS probe and can be optionally interfaced with the sample collection and conditioning system 24 and/or the sample analysis system 26. In an embodiment, the sample collection and conditioning system 24 is an integral part of the SMS probe. In particular, once the sample is acquired, the sample can be conditioned and/or collected. Once the sample is acquired, components (e.g. compounds, biomolecules (e.g., proteins, DNA, RNA, and the like), and the like) of the sample can be ionized and analyzed using the sample analysis system 26, which is described in more detail herein. In an embodiment, as the sample is acquired, the sample is ionized to form ionized components (e.g., ionized compounds, ionized biomolecules, and the like), which can be subsequently analyzed using a mass spectrometer, for example.

The stage position and control system 16 can include a stage that can be used to move the object relative to the SMS probe so that the position at which a sample is acquired is known and the position can be adjusted to acquire multiple samples from the object. The stage can be used to move a stage in the x-, y-, and/or z-directions relative to the SMS probe. In an embodiment, both the stage and the SMS probe can be moved in the x-, y-, and/or z-directions relative to one another. In an embodiment, the stage can include a cooling/heating system to control the temperature of the object. In an embodiment, cooling/heating system can include a thermoelectric device independently or integrated into a stage, a liquid cooled/heated stage, a phase-change thermal energy storage material (PCM), resistance heaters, and the like.

In an embodiment the SMS imaging probe system can include an optical system (e.g., laser) that can direct optical energy onto the object to heat the object, the liquid on the object, to cause a reaction, and the like.

The scanning electron microscopy system 12 can include an electron microscope that can produce an image of the object and/or the liquid by scanning the object with a focused bean of electrons. The image produced by the scanning electron microscopy system 12 can include the topography of the object and/or liquid so that the image can be used to position the SMS probe and the object and/or liquid relative to one another so that a sample(s) can be acquired using the SMS probe.

The SEM image acquired using the scanning electron microscopy system 12 can be used to know the exact location where the sample was taken form the liquid and/or object, which enables a correlation to be made between the component(s) and the sample location. The area of the pool of liquid gives the spatial extent of the area which can be imaged continuously. The sampling area is defined by the pool of liquid and is controlled, at least in part, by the size and/or geometry of the pool. As a result, a simultaneous topographical (e.g., location) map of the components in the sample/object (a "topographic map" of species of the sample extracted from an object) can be obtained. Therefore, simultaneous or substantially simultaneous chemical analysis of the sample extracted from an object and an object topographical imaging can be conducted, which can be used to identify the component composition of a sample at different locations on or in the object (e.g., in the x-, y-, and/or z-axis). In this manner, a plurality of areas of the object in the x-, y-, and/or z-axis directions can be analyzed to obtain topographic and chemical composition maps of the object, which can provide insight into the chemical and/or biological species located at one or more locations within and/or on the surface of the object. In an embodiment, multiple areas on an object, different objects, and/or different compartments can be analyzed simultaneously using an array of SMS probes.

Embodiments of the present disclosure are advantageous in that in situ simultaneous biochemical analysis and object imaging can be performed. For example, an analysis can be conducted for one or more areas of an object to determine the component composition (e.g., chemical and/or biological composition) of each of the areas of the object. In another example, embodiments of the present disclosure can be used to study complex biological samples, where the component composition and/or topography can vary greatly from one area of the object to another. In another example, embodiments of the present disclosure can be used to study biological molecules on a single cell basis and/or to study the biological molecules on the surface of the cell and/or within the cell. In another example, embodiments of the present disclosure can also be used for detection of biochemical molecules that are intrinsically charged or that can be externally (e.g., electrochemically or via electrospray ionization) charged (e.g., proteins, DNA, RNA, and the like). Such functionalities would be useful in analyzing biological tissue constructs, analyzing DNA/RNA/protein gel microarray readouts, screening tasks, such as catalyst libraries, bio-manufacturing, such as depositing (printing) biomolecules on substrates, and the like.

The liquid pool forming system 18 can be used to form a pool of liquid (e.g., water, cell culture medium (e.g., neuronal cell culture media, epithelial cell culture media), ionic liquids (e.g., LiBr, cyclohexane), and a combination thereof) on the object. In an embodiment, the pool of liquid can be formed by condensing a vapor on the object. In an embodiment, the pool of liquid can be formed by disposing a liquid directly on the object. The pool of liquid can be disposed on a portion of the object, over the top surface of the object, all around the object, and the like. In an embodiment, the pool can have a lateral dimension of about 1 to 10 µm. The lateral dimension of the pool controls the lateral extent of the sampled area, wherein the extent can be about 1-5 µm to 1-5 mm.

The solvent/agent delivery system 22 can be used to dispose a solvent, an agent (e.g., drug, biomolecule, or the like), or the like, into the pool of liquid. In an embodiment, the solvent or agent can be delivered in a manner such as that described for the liquid pool forming system 18. In an embodiment, the solvent can include water, methanol, ethanol, chloroform, acetonitrile, formic acid, organic solvents (e.g., toluene), amines or a combination thereof.

The collection and conditioning system 24 can be used to collect the samples and/or condition (e.g., dissolving the sample, ionizing the sample, desalting the sample, performing a buffer exchange on the sample, or fragmentation of the sample) the sample. In an embodiment, the sample can be collected for future analysis, combined with other samples, combined with a calibrant (standard) for quantitative measurements, delivering a sample on a different substrate, or the like.

In regard to conditioning, the sample can be conditioned within the SMS probe system or separately form the SMS probe system. In an embodiment, the sample can be reconditioned by reducing or removing the salt from the sample using a microdialysis device since many biological fluids contain a relatively large amount of salt, which can be detrimental for mass spectrometry analysis. The object components can be selectively solubilized by exposure to different chemicals/solvent, for example using detergents such as chloroform for solubilizing lipids from biological cell membranes. The sample can be ionized using a variety of means, including electrochemical charging via redox reactions or well-established principles of electrospray phenomena. Fragmentation of the sample can be achieved via either chemical (e.g., tryptic digestion) or physical (e.g., applying electrical or mechanical fields of modulated strength) means. Furthermore, monolithic integration of mass/ion exchangers using microfabrication packaging techniques with the SMS probe allows for using an internal standard to achieve truly quantitative imaging mass spectrometry. This capability for in-line solvent conditioning without external sample preparation can be used to eliminate many sources of experimental uncertainty and variability.

The sample analysis system 26 can be used to determine the identity of component(s) in the sample. In an embodiment, the sample analysis system 26 can includes a mass spectrometry system such as an electrospray ionization mass spectrometer system, an desorption electrospray ionization mass spectrometer system, and a matrix assisted laser desorption ionization mass spectrometer system, antibody-antigen assays, gene microarrays, electrochemical biosensors, IR and Raman spectroscopy, and/or Nano/MicroElectroMechanical System (NEMS/MEMS) sensors. In regard to the mass spectrometry system, the mass spectrometry system can include an ion detector for recording the number of ions that are differentiated according to an arrival time or position in a mass spectrometry system, as is known by one skilled in the art. Ion detectors can include, for example, a microchannel plate multiplier detector, an electron multiplier detector, or a combination thereof. In addition, the mass spectrometry system includes vacuum system components and electric system components, as are known by one skilled in the art.

In another embodiment, the sample analysis system 26 can include antibody-antigen assays, gene microarrays, electrochemical biosensors, IR and Raman spectroscopy, and Nano/MicroElectroMechanical System (NEMS/MEMS) sensors. Embodiments including one of these types of sample analysis systems 26 may or may not need to include an ionization step.

Figure 2:
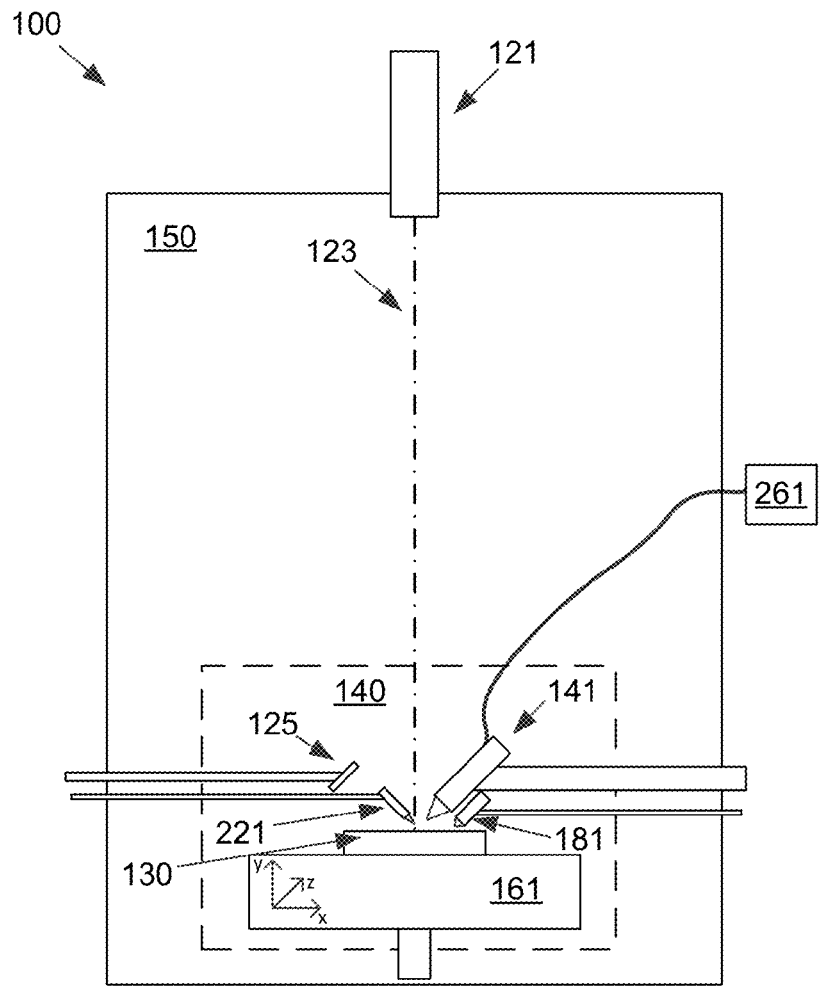
FIG. 2 is a schematic of an embodiment of a SMS probe SEM imaging system.

Now having described the SMS probe system in general, the following provides additional details regarding the SMS probe system and components of the SMS probe system. FIG. 2 is a schematic of an embodiment of a SMS probe imaging system 100. In an embodiment, the SMS probe imaging system 100 includes a scanning electron microscopy device 121 that emits an electron beam 123 at an object 130, where the electrons interact with the object and produce various signals (e.g., secondary electrons) that can be detected by a detector 125. The collected signal can be used to form an image of the object and the position of the SMS probe so that the position of the probe is known. The configuration of the electron microscopy device 121 and the detector 125 can be adjusted as needed for the particular setup. Electron scanning microscopy devices are well known and can include devices such as FEI Quanta 200 SEM, Hitachi TM30303 SEM, Zeiss EVO LS 25 variable pressure SEM.

The object 130 (e.g., such as a cell, tissue, sealed compartment, etc.) is positioned on a stage 161, where the stage can be moved in the x-, y-, and z-directions to position the object relative to the SMS probe 141 (e.g., one or both of the stage and the SMS probe can be adjusted to position the object relative to the SMS probe). The SMS probe 141 can be interfaced with a sample analysis system 261 (e.g., a mass spectrometry system). In an embodiment, an object cooling/heating system can be included to adjust the temperature of the object 130. The object cooling/heating system is optionally included in some embodiments such as in the ESEM mode. As noted herein, the object cooling/heating system 181 can include a thermoelectric device independently or integrated into a stage, a liquid cooled/heated stage including a cryogenic/refrigeration loop, a phase-change thermal energy storage material (PCM), resistance heaters, and the like, which can cool the object to about −40 to 11° C.

The pool of liquid is formed using a liquid pool forming device 221. In an embodiment, the liquid pool forming device 221 can include a nozzle liquid injection system, a nozzle vapor injection system, liquid/vapor injection through a valve-controlled opening within the stage 161 supporting an object being analyzed, stage-integrated vapor/liquid/solid injection, and mechanical manipulators (e.g., AFM probe). As described herein, the nozzle liquid injection system can be used to directly dispose a liquid onto the object 130. In an embodiment that uses a nozzle vapor injection system, a cooling/heating system, can be used to assist in condensing the vapor onto the object to form the pool of liquid. The vapor or liquid can be supplied to these systems using known methods and devices. The specific design of the nozzles is not important other than they are designed to form the desired size pool of liquid on the desired location.

In an embodiment, the SMS probe imaging system 100 can include two pressure and temperature zones, pressure zone A 150 and pressure zone B 140. The two different pressures are used to maximize the SEM produced image (e.g., electron beams have less scattering at low pressures) and the ability to form the pool of liquid on the object. For example this configuration is used in the ESEM mode. Pressure zone A 150 can be at a pressure of about $10^{-4}$ to $10^{-6}$ torr and a temperature of about 20 to 40° C. Pressure zone B 140 can be at a pressure of about 5 to 10 torr and a temperature of about −270 to 20° C. or about −40 to 20° C. In an embodiment the two pressure zones can be separated by walls of enclosure, which has a small aperture for transmitting the electron beam from zone A to zone B.

In an embodiment using a sealed compartment, only a single zone is present, zone A 150, which can be at a pressure of about $10^{-4}$ to $10^{-6}$ torr and a temperature of about 20 to 40° C. It should be noted that the pressure in the sealed compartment (e.g., WetSEM®) can be about 0.1 to 2 atm and at a temperature of −40 to 40° C., so that the material (e.g., cell, tissue, etc.) can be sampled at a broad range of conditions, including physiologically relevant conditions. In this embodiment, a single low pressure (high vacuum) zone can be used to maximize resolution of the SEM image and this can be done since the object is positioned in a sealed compartment.

Figure 7:
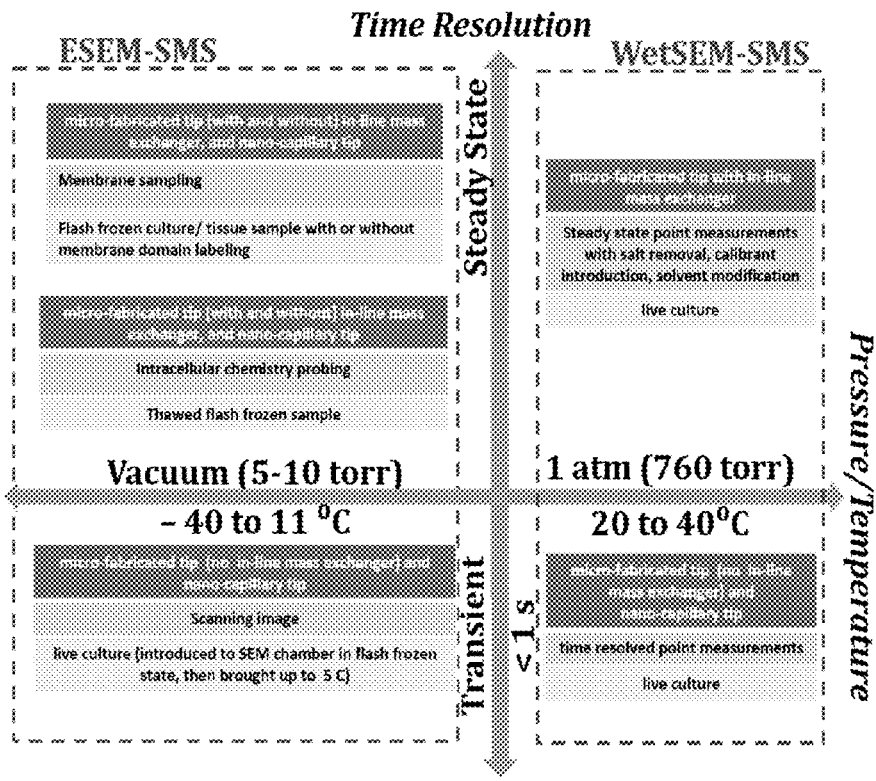
FIG. 7 illustrates SMS probe imaging experiments (ESEM-SMS and WetSEM-SMS) organized around thermodynamic conditions of sample and time resolution. Each experiment type is a shown in a three section sub-table: (dark blue rows) probe tip type-nano-capillary, micro-fabricated tip, or micro-fabricated tip with in-line mass exchanger; (medium blue rows) description of measurement type; (light blue row) sample type.

FIG. 7 illustrates SMS probe representative imaging experiments for biological objects organized around thermodynamic conditions of sample and time resolution. Each experiment type is a shown in a three section sub-table: (dark color rows) probe tip type-nano-capillary, micro-fabricated tip, or micro-fabricated tip with in-line mass exchanger; (medium color rows) description of measurement type; (light color row) sample type.

Now having described the SMS imaging probe system and how it operates, additional details regarding the SMS imaging probe system will be provided.

Embodiments of the present disclosure are capable of maintaining a condensed liquid phase at the interface of the object to be imaged. This is advantageous because: (1) most biological processes occur in liquid; (2) Electrospray Ionization (ESI) can be used; and, (3) selective solubilization can be conducted by introducing a liquid phase of limited spatial extent to extract samples and to 1 localize the chemical image, which other techniques are not able to do. The liquid in the pool can include, but is not limited to, water, salts, acids, organic solvents (i.e. methanol, toluene, and amines), and combinations thereof.

As mentioned above, embodiments of the present disclosure provide for two approaches to sample environment control: condensed phase and injected liquid modes. For example, under sub-ambient pressure/reduced temperature, both condensed phase and injected liquid modes can be used (e.g., ESEM mode). Condensed phase mode allows for full hydration of samples, while liquid injection can be used for selective solubilization and control of the extent of collection domain. In an embodiment, physiologically relevant temperature ranges and pressure can be used for nano-capillary sampling by penetrating sealed compartments such as Wet-SEM® enclosed samples.

The liquid phase (e.g., pool of liquid) can be introduced/maintained using a few options. One option is based on a conventional Environmental Scanning Electron Microscope (ESEM) environment with dual chambers—the high vacuum domain for passing the high energy electron beam with minimal scattering (to maintain high spatial resolution) and a low vacuum domain (small in size to minimize the beam scattering) where the solvent vapor (typically water-based for biological applications) is introduced via a gas delivery line. The liquid phase can be introduced, maintained and controlled through manipulation of vapor condensation and/or liquid micro-injection. For the solvents, the degree of sub-cooling required for vapor condensation and liquid droplet formation can be determined by the saturation temperature at the about 5-10 Torr typical pressure in the low-vacuum ESEM chamber, and varies from 1-11° C. for water to −35 to −40° C. for chloroform. In another embodiment, sealed compartments or capsules (e.g., WetSEM® capsules) include the object and the liquid, which are introduced into an SEM chamber. These sealed compartments use a sub-micron thick cover or film (e.g., polyimide cover film) that is "transparent" to high energy SEM electrons as a window to a sealed environment containing liquid and material (e.g., cells, tissue, etc.), and thus enable SEM imaging of the object at temperatures (e.g., about 11 to 40° C.) and pressures (e.g., about 1 atm) consistent with normal cell function.

In an embodiment, a pool of liquid can be nucleated by condensation of externally introduced solvent vapors on the object using micro-injection nozzles and local sub-cooling below the saturation temperature. In another embodiment, the pool of liquid can be directly formed by disposing the liquid on the object. Through manipulation of pool composition, one can perform targeted solubilization (optional), protein digestion (optional), and solution manipulation (optional) to vary preferential ionization. Mass spectrometer sensitivity determines the smallest number of cells that must be sampled for detection and identification of a given chemical species. In an embodiment, a SMS probe based experiment can subject a cell sample (e.g., control or agent-exposed culture) to solvents of different compositions, confining the exposure domain within pools of controlled sizes (which will define spatial extent of sampling), and subsequent ESI-MS in positive (i.e., analyte charging via cation adduct formation) and/or negative (i.e., analyte charging via anion adduct formation) modes using passive sampling by the SMS nano-electrospray probe. Embodiments of the present disclosure can address a number of biomolecule sensing needs, including molecular size, abundances, temporal evolution (kinetics and transport), and localization using a judicious combination of the solvent chemistry, solvent pool size, and ion sampling strategy for different target biochemicals and cellular processes.

Embodiments of the SMS probe can be used to sample a solution passively and minimize the length of the sample liquid flow path from sampling point to spray point, thus providing the shortest response time possible, which makes transient imaging experiments practical. By using SEM imaging to precisely position the SMS probe tip, the SMS probe can have the ability to perform in vitro imaging, i.e., imaging of live biological samples and ultimately even to perform real time analysis of individual cells.

Transient sampling from solution is made possible by implementation of the nano-ESI concept, Reverse-Taylor-Cone ESI in either continuous or pulse mode. The relocation of the electrospray to the sample point (i.e., in situ ESI), and the resulting ion source is called the Scanning Mass Spectrometry (SMS) probe because it can be used for scanning probe chemical microscopy and for spatially-resolved imaging of topologically complex submerged interfaces (e.g., sealed capsules or ESEM chamber). Thus, embodiments of the SMS probe can acquire a sample and simultaneously or substantially simultaneously ionize the components for electrospray. In other embodiments, the sample acquisition and the ionization can be separated by a relatively short distance, for instance in embodiments that condition the sample.

Figure 3:
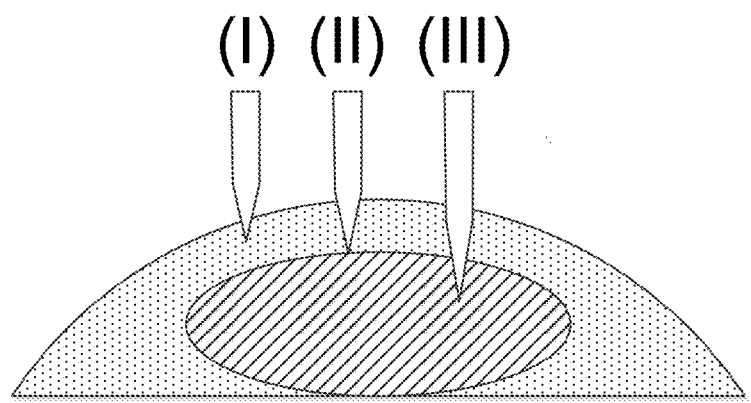
FIG. 3 is a schematic that illustrates three different ways in which the SMS probe can obtain a sample.

FIG. 3 is a schematic that illustrates three different ways in which the SMS probe can obtain a sample. In one embodiment, the SMS probe samples the pool of liquid on the object (FIG. 3, (I)). In another embodiment, the SMS probe samples the area adjacent to the object, which includes sampling the pool adjacent the object, or from within the boundary/interface of an object (e.g., cell membrane) (FIG. 3, (II)). In another embodiment, the SMS probe samples the inside of the object, such as the inside of a cell (FIG. 3, (III)).

Embodiments of the present disclosure provide for a nano-technology-enabled instrument for multi-mode imaging, with sub-cellular spatial resolution, of objects such as biological objects (e.g., cells, tissue, etc.) within an aqueous micro-environment. In an embodiment, the extra-cellular chemistry and topology at precisely controlled locations in the immediate vicinity of a cell or tissue membrane can be monitored using the SEM image and the SMS probe. In addition, trans-membrane probing of cells' internal biochemistry can be conducted by inserting the SMS probe tip into the cell. In an embodiment, the chemical imaging by the SMS probe can be performed via mass spectrometry (MS), in which case labeling is not required, thus enhancing discovery potential. An embodiment of the present disclosure is capable of conducting dynamic imaging with millisecond temporal resolution, to allow the real-time monitoring of many physiological processes.

An embodiment of the SMS probe imaging system includes an intake tip that can perform nano-capillary sampling. The flow through the SMS probe is driven by electrohydrodynamic phenomena. Thus the probe passively samples directly from a submerged liquid environment and enables both dynamic imaging of the extra-cellular biochemical environment and subcellular resolution chemical profiling of membrane content. In this regard, an embodiment of the SMS probe includes a nano-capillary probe tip having an inner diameter of about 1 μm to 5 μm. In general, the intake-tip can be of tapered shape to minimize the hydraulic resistance for capillary suction of the sample fluid with a length sufficient to penetrate the depth of the object (e.g., 10-100 micrometers).

Embodiments of the present disclosure can improve spatial resolution by reducing the sampling capillary radius of the SMS probe tip, while enhancing temporal resolution requires a decrease in both capillary radius (e.g., about 100 nm to 1 μm) and capillary length (e.g., about 1 μm to 10 μm or about 10 μm to 100 μm when no conditioning of the sample is to be performed), which is to minimize sample residence time in the probe. The theoretical limit for spatial and temporal resolution would be realized by an electrospray event that occurs at the sampling point, i.e., capillary length is zero. The SMS probe, therefore, is based on sampling through a flow path of the smallest length and smallest inlet orifice radius possible. Flow path length is determined by combined dictates of desired sample processing (if any), minimum necessary electric field focusing for a given operational mode (transient spray enables shorter flow path), and capabilities of the available fabrication techniques. Radius is limited only by fabrication methods, the practical limit of avoiding clogs, and keeping hydraulic resistance below the maximum threshold for passive electrospray.

Embodiments of the SMS probe can include structures based on batch micro/nano-fabrication. In an embodiment, the microfabricated SMS probe can include a microfabricated sampling tip with an integrated counter electrode. In an embodiment, batch micro/nano fabrication of the SMS probe both with and without monolithically-integrated sample conditioning (e.g., de-salting) and introduction of internal calibration standards. The added capabilities due to micro/nano-scale control of dimensions and integration of an in-line mass exchanger are (1) salt removal and sample conditioning for higher SNR mass spectra (enhanced sensitivity and resolution), (2) calibrant introduction for quantitative measurements, (3) controlled probe-tip depth penetration into sealed compartment (e.g., WetSEM® capsules), and/or (4) improved reproducibility and reliability in performance and operation of the SMS probe in transient imaging mode due to precise control of the probe dimensions. In an embodiment, the microfabricated SMS probe tip, which enables salt removal, sample conditioning, and calibrant introduction, can include an integrated mass-exchanger, and an electrospray tip.

In an embodiment, the SMS probe tips can be pulled glass capillaries (sampling orifice dimensions from 200 nm to 2 μm) and the internal surface can be made non-wetting via silanization to prevent flooding, and electrospray voltage applied to the liquid/vapor interface via an internal wire counter-electrode.

Figure 14A:
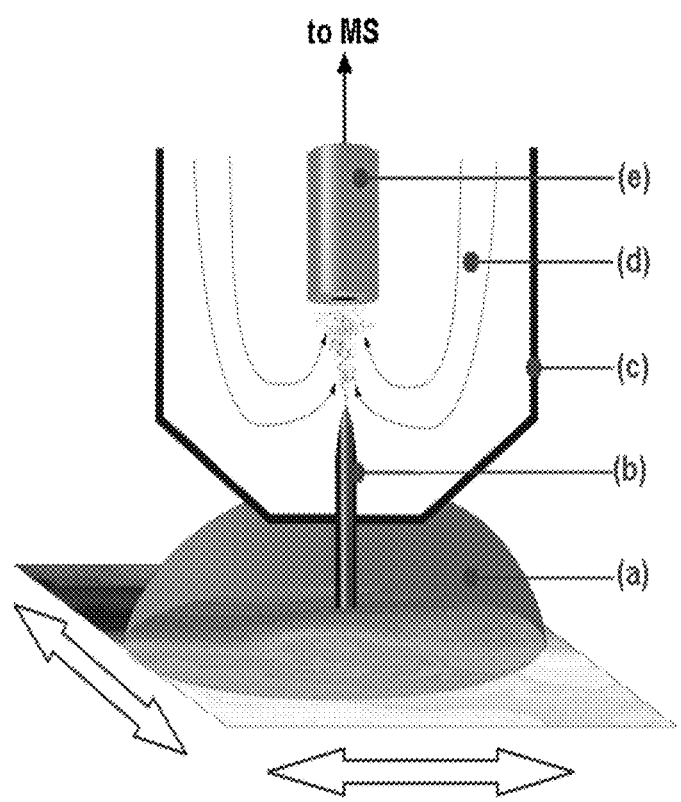
FIG. 14A illustrates a schematic of an embodiment of the SMS probe as an electrospray ion source for imaging mass spectrometry of submerged surfaces and transient events in solution.

One embodiment of the SMS probe is based on a sampling capillary with an integrated counter electrode to generate electrospray, as shown in FIG. 14A. Fused silica sampling capillaries have been used and can have about a 10 μm inner diameter to 50 μm inner diameter and can be about 8 mm to 3 cm in length. All of the capillaries have a tapered outer diameter at the spray end. Some of the capillaries were purchased (New Objective Silica Tips), while others we fabricated in-house using meniscus etching. Further details are available in reference (Kottke, P. A., Degertekin, F. L., and Fedorov, A., The Scanning Mass Spectrometry Probe: a scanning probe electrospray ion source for imaging mass spectrometry of submerged interfaces and transient events in solution, *Anal. Chem.*, 82 (1), 19-22 (2010), which is included herein by reference)

The SMS probe can be used to ionize the components of the sample using electrospray techniques. In an embodiment, the SMS probe is appropriately interfaced (e.g., electrically isolated) so that different electric potentials can be applied to produce an appropriate electric field for driving ions via electromotive force. Upon application of an appropriate electric potential (voltage) to the SMS probe tip, a reverse-Taylor cone of the electrolyte is electrohydrodynamically-induced and extends through the orifice of the tip. The reverse-Taylor cone is similar to the conventional Taylor cone used in electrospray, except rather than spraying a solution out of a capillary tube filled with the electrolyte solution to form a cone and disperse fluid into droplets, the cone described herein starts outside of the capillary (either at the free surface of the liquid or at the orifice) and then is drawn into the sampling capillary (ion generation chamber) by the electric force exerted on the electrolyte ions upon application of appropriate electric field created due to different voltages applied (e.g., can you describe this). The formation of the reverse-Taylor cone is dependent, at least, upon the sample fluid, the diameters of the orifice, one or more of the applied electric potentials (electrode voltages), the electrode locations, the strength and orientation of the electric field, and the like. Once the components are ionized, they can be analyzed using a mass spectrometry system, for example.

Figure 4:
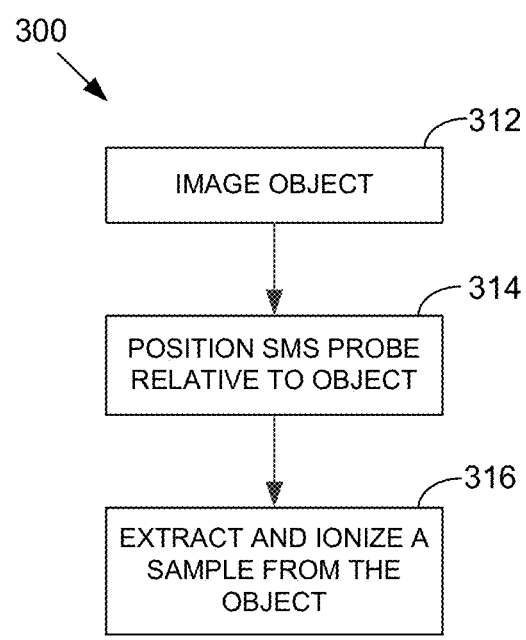
FIG. 4 is a flow chart illustrating a method of using a SMS probe imaging system.

FIG. 4 is a flow chart illustrating a method 300 of using a SMS probe imaging system. In block 312, an object is imaged to produce an object image. The object can be imaged using a SEM system such as that described in reference to FIG. 1 or FIG. 2. In block 314, the SMS probe and the object can be positioned relative to one another at a first position using the object image obtained using the SEM system. In an embodiment one or both of the SMS probe and the stage upon which the object is positioned can be moved to position the SMS probe in the desired location. In block 316, a sample can be extracted from the object (e.g., the pool of liquid, adjacent the object, or within the object) in the first position using the SMS probe and ionized. If desired, the SMS probe and the object can be positioned relative to one another at a second position using the object image and the process repeated. This can be performed as needed to analyze the object(s).

As described herein the SMS probe imaging system can be operated in the ESEM mode or the sealed compartment mode. In the ESEM mode a low vacuum chamber surrounding the object and the SMS probe can be used. The pressure in the low vacuum chamber can be about 5 to 10 torr and the temperature inside the low vacuum chamber can be about −40° C. to 11° C. In the sealed compartment mode the pressure in the sealed compartment is about 0.1 to 2 atm and the temperature inside the low vacuum chamber can be about 20° C. to 40° C.

FIG. 5 is a flow chart illustrating a method 400 of using a SMS probe imaging system that is in the ESEM mode. In block 412, a liquid pool can be formed on the object. In block 414, an object is imaged in the pool to produce an object image as described herein. In block 416, the SMS probe and the object can be positioned relative to one another at a first position using the object image obtained using the SEM system. In block 418, a sample can be extracted from the object (e.g., the pool of liquid, adjacent the object, or within the object) in the first position using the SMS probe and ionized. If desired, the SMS probe and the object can be positioned relative to one another at a second position using the object image and the process repeated. This can be performed as needed to analyze the object(s).

When operating in ESEM mode, low temperatures are used, which typically slow down the rate of chemical reactions in biological systems and even block some physiological events; but slowing reaction rates may have the beneficial effect of allowing one to capture fast biochemical reactions. Regardless, the advantage to ESEM mode is dynamic control of the liquid composition and liquid domain extent. This enables not only control over spatial extent of sampling, but also selective solubilization of cell membranes (a destructive imaging mode). The liquid solvent droplet size can be controlled by adjusting the injection flow rate, injection nozzle placement, and nozzle and substrate temperature, which combine to determine the condensation rate on a given substrate. For ESEM operation, the condensation rate can exceed the liquid removal rate (via combined evaporation rate and probe sampling rate) for droplet/pool growth, or be below the removal rate to reduce droplet/pool size. Once a condensed phase is formed, droplet composition can be altered through condensation of additional solvents, as well as direct microinjection of liquid phase solvents into the pool. An alternative approach to droplet deposition is maintenance of a thin liquid micro-layer above the tissue sample through stage-integrated cooling of the entire sample to below the saturation temperature for the bulk vapor component; this approach is particularly useful if scanned images of low temperature cellular secretions are desired.

FIG. 6 is a flow chart illustrating a method 500 of using a SMS probe imaging system that is in the sealed compartment mode. In block 512, an object is loaded into the compartment and sealed. An exemplary embodiment of a sealed compartment is a WetSEM®. In block 514, an object in the sealed compartment is imaged to produce an object image as described herein. In block 516, the SMS probe and the object can be positioned relative to one another at a first position using the object image obtained using the SEM system. In block 518, a sample can be extracted from the object (e.g., the pool of liquid adjacent to the object, from the object's boundary or from within the object) in the first position using the SMS probe. This method allows for the samples to be acquired under physiological conditions. If desired, the SMS probe and the object can be positioned relative to one another at a second position using the object image and the process repeated. This can be performed as needed to analyze the object(s) and/or different compartments in the WetSEM®.

One of the target cell's compartments is the cell membrane, and therefore target chemical classes can include membrane proteins (including glycoproteins) and lipids (phospholipids, glycolipids, and cholesterols). Solubilization and extraction of membrane components can be done via organic solvents. Another compartment of interest is the cell interior, to a certain extent, where application of the SMS probe is accomplished simply through application of different chemistry; after the cell membrane is disrupted, the cytoplasmic contents are preferentially solubilized in an aqueous droplet from which it is sampled using the SMS probe. Yet another compartment of interest is cell nucleus, in which the nuclear membrane is ruptured, and the content is sampled using SMS probe. The expected nuclear components of importance are phosphorylated transcription factors, and DNA fragments (an apoptosis marker), both of which only originate in the nucleus; thus, although nuclear components may be detected concurrently with extra-nuclear chemicals, this will not preclude localization for mechanism reconstruction due to the unique chemical signatures of molecules originating from the cell nucleus or organelles.

In an embodiment, a plurality of SMS imaging probes to analyze an object(s), a plurality of objects, multiple compartments in a WetSEM®. In this regard, the SMS imaging system can include an array analysis system that would operate similarly to the SMS imaging system described herein directed to using only a single SMS probe.

While embodiments of the present disclosure are described in connection with the Examples and the corresponding text and figures, there is no intent to limit the disclosure to the embodiments in these descriptions. On the contrary, the intent is to cover all alternatives, modifications, and equivalents included within the spirit and scope of embodiments of the present disclosure.

Example 1

The SMS probe has been operated under ambient and sub-ambient conditions. In addition, the SMS probe imaging system has been shown to have capabilities for controlled water condensation and stable liquid interface formation on specially-designed nanostructured amphiphilic substrates with spatially-varying surface chemistry. An embodiment of the SMS probe has been microfabricated with integrated microdialysis, solvent conditioning, and calibrant introduction and has been shown to produce "analytically clean" mass spectrometric (MS) protein spectra.

Figure 15:
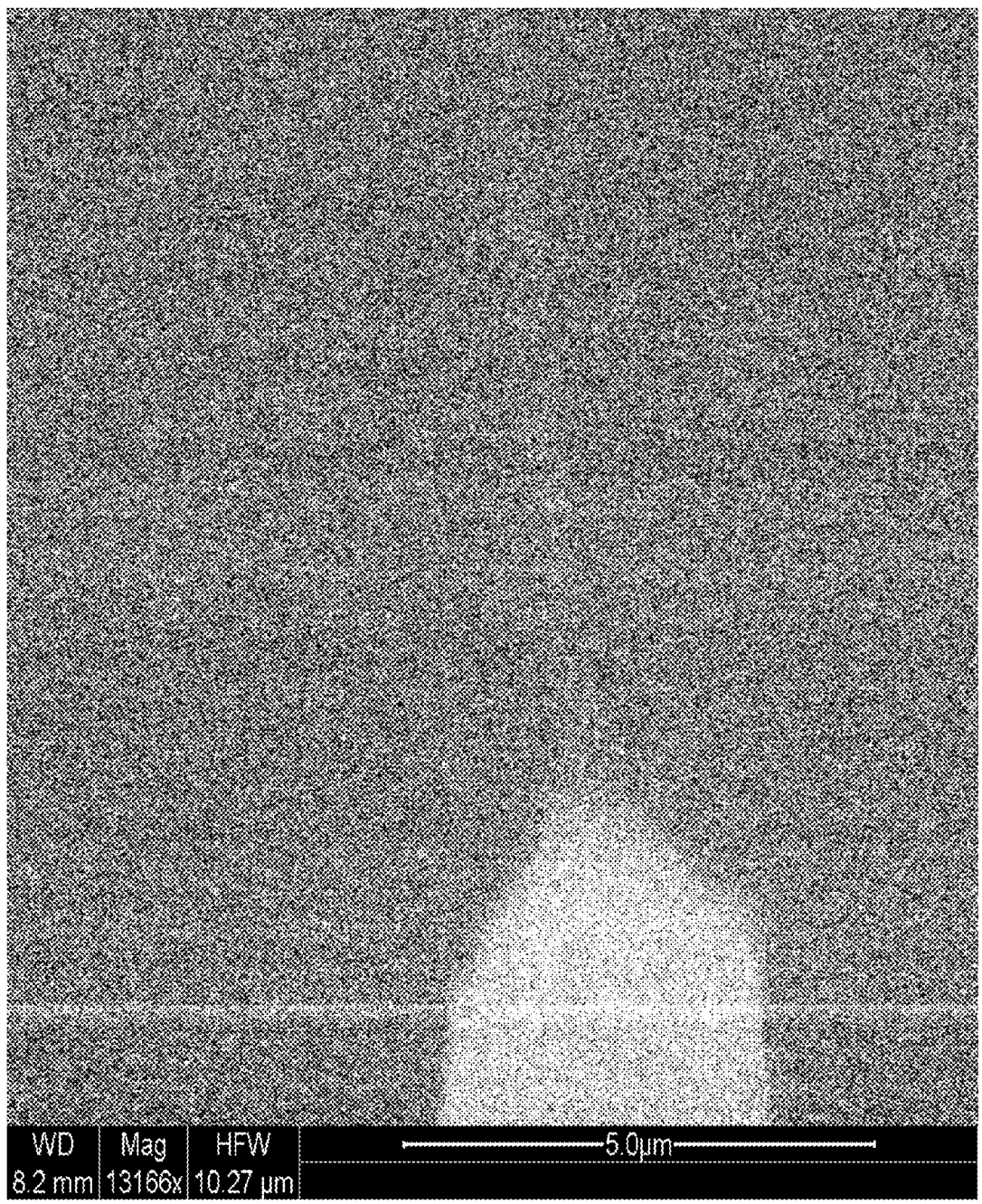
FIG. 15 illustrates the electrospray formation from the SMS probe capillary as imaged by electron beam in ESEM environment.

Since the gas phase environment may be sub-atmospheric, one has to be concerned whether the combined capillary and electrohydrodynamic stresses will provide a sufficient driving force to pull the liquid through the SMS probe channel for stable electrospray. It has been shown that at sub-ambient conditions a sub-cooled stable Taylor cone and electrospray of water inside the ESEM chamber can be performed, which demonstrates the viability of the described role of nano-electrospray as part of the ESEM-SMS Probe. FIG. 15 illustrates the electrospray in ESEM environment. In particular, FIG. 15 illustrates the Taylor cone formation from a nano-ESI tip of the SMS probe with a 2 μm orifice, resulting in the electrospraying jet about 100 nm in diameter, as visualized using electron beam imaging inside the ESEM environment.

Example 2

An embodiment of the ESEM-SMS system can dissolve a spatially confined portion of a sample surface for ESI-MS analysis. This capability is initially developed in the context of sampling lipids and cholesterol from an artificial bilayer well below the phase transition temperature. Phase separation can be induced in a planar supported artificial bilayer composed of equimolar sphingomyelin, dioleoylphosphatidylcholine (DOPC) and cholesterol, through temperature change. The ordered cholesterol/sphingomyelin domains, can be labeled by binding mono-sulfo-NHS-Nanogold® to the amine groups of the sphingomyelin. Alternatively, similar bilayers can be formed with the addition of 1 mol % of a glycoshphingolipid, GM1. GM1, which is enriched in the cholesterol/sphingomyelin domains, binds specifically with cholera toxin subunit B (CTx-B) conjugated to biotin. Subsequently, the GM1-CTx-B complexes can labeled with streptavidin conjugated gold nanoparticles. Then, the sample can be flash frozen[35] and transferred (still on the substrate) to the ESEM thermoelectrically cooled stage, which maintains the temperature at −35 to −40° C. In the ESEM, the sampling nano-capillary can be positioned within ~1 μm of the substrate at locations correlated with immunogold labeling using SEM imaging, and a sub pico-liter droplet of chloroform is injected at the sampling capillary site. At this point, SMS probe enabled ESI-MS analysis of the local bilayer composition can be performed.

Example 3

Figure 8:
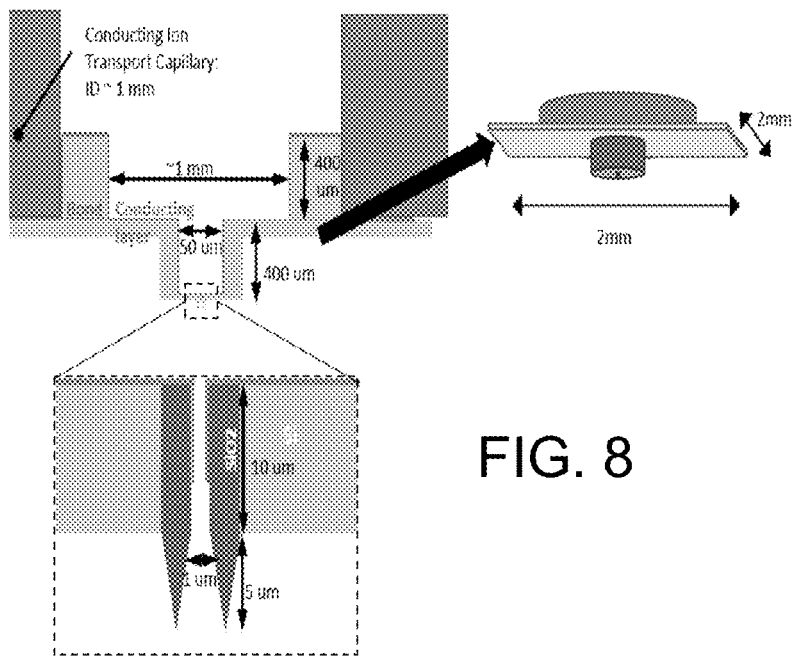
FIG. 8 illustrates a schematic of the sampling tip section, which is micro/nanofabricated from a Si wafer. Electron beam and standard photolithography, dry etching, and anodic bonding will be used to create an array of monolithic devices at the wafer scale. Metallization via electron beam evaporation establishes the required electrically conducting layer for applying the electrospray potential. Dicing completes the fabrication process, and conductive adhesive will affix the tip to the ion transport tube for coupling to mass spectrometer or other sensing device.

Improved repeatability and low cost are key results of batch microfabrication. In combination with nano-fabrication, it enables control over critical dimensions of the sampling capillary, including monolithic integration of counter electrodes for more repeatable performance (FIG. 8) and incorporation of a solvent conditioning and internal calibrant introduction module. Precise sampling capillary dimensions are necessary for carefully controlled penetration of the sealed capsule (WetSEM®) membrane by positioning of the sampling orifice at the desired location relative to the encapsulated sample/object. The basic processes for probe microfabrication have been demonstrated. It remains to push the current process to its limits, fine tuning steps as necessary to retain reproducibility and functionality of the end product while reducing the sampling tip channel diameter. This is accomplished by creating a mask with a range of feature diameters from the current 20 μm down to 2-3 μm or below using e-beam lithography. The critical parameters of the microfabrication process, i.e., thickness of photoresist, thickness of oxide layer, deposition times and etch times during Bosch process etching, etc., can be optimized to achieve desired precision of the feature dimensions. Another important aspect of the SMS probe microfabrication is the tip reshaping to enhance electric field focusing and to reduce required flowrate.

Example 4

Figure 9:
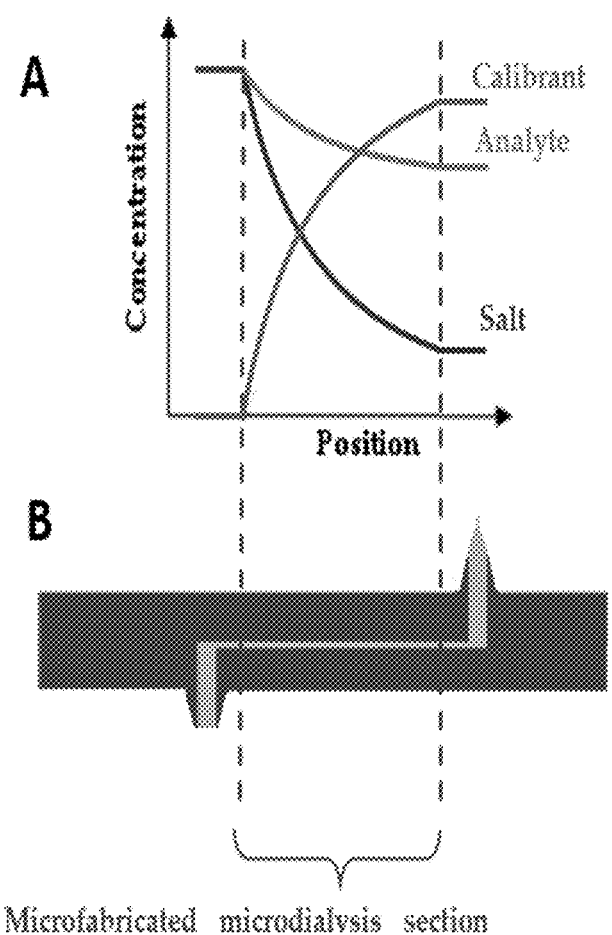
FIG. 9 illustrates evolution of the analyte, calibrant and salt concentrations in the microdialysis (sample conditioning) section of the SMS probe. Incorporation of a microfabricated mass/ion exchange section (FIG. 9B) into the SMS probe enables sample conditioning with minimal detrimental effect on temporal resolution (FIG. 9A). The mass exchanger calibrant can be introduced in a well characterized manner, allowing quantitative mass spectrometric analysis, and salt can be removed with concurrent exchange of solvent, to improve sensitivity.
Figure 9C:
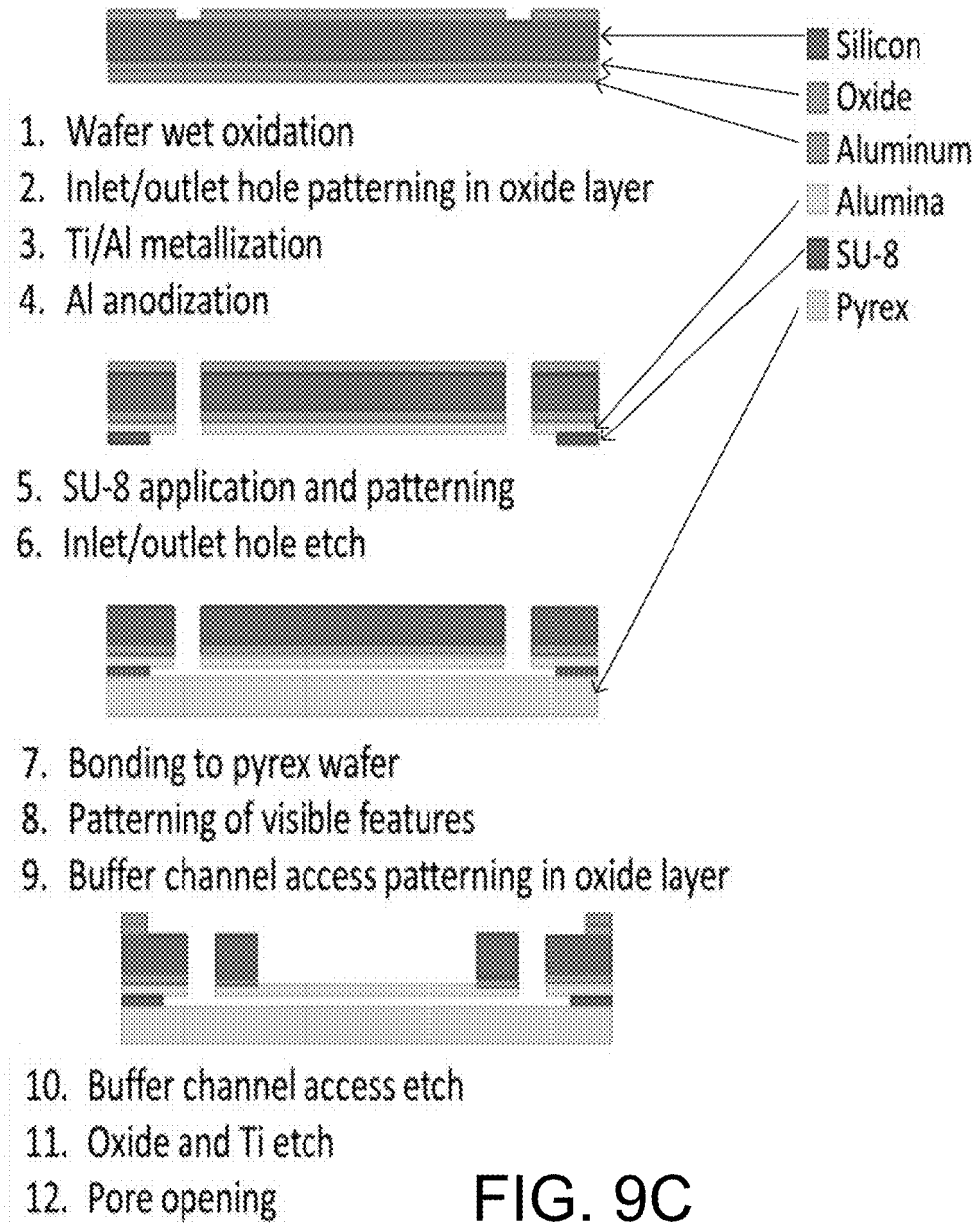
FIG. 9C illustrates a schematic of a process for making an embodiment of a microfabricated microdialaysis device.

Another strategy for dealing with sample complexity is in-line integrated batch micro-fabricated sample treatment approach. The SMS probe with a solvent conditioning and internal calibrant introduction module can have a slightly longer flowpath than the high temporal resolution microfabricated SMS probe (FIGS. 9A and 9B). The additional distance is required to allow transport out of the sample channel of adduct forming cations and transport in to the sample channel of charge promoting acids and solvents, and of calibrant molecules. This transport is to be accomplished without appreciable loss of analyte biomolecules, and this is possible because of a substantial mismatch in diffusion coefficients between analyte, solvents, and cations involved in adduct formation. Furthermore, the additional length of the sample flowpath requires, for sub 10 μm inner diameter sampling channels, an additional force to drive flow at a rate sufficient to maintain stable ESI. This force is provided by electro-osmosis. Using the conditioning liquid as a conducting path enables incorporation of electro-osmotic pumping without introduction of electrolytically generated bubbles into the sample stream. FIG. 9C illustrates a schematic of a process for making an embodiment of a microfabricated microdialaysis device.

Example 5

Figure 10:
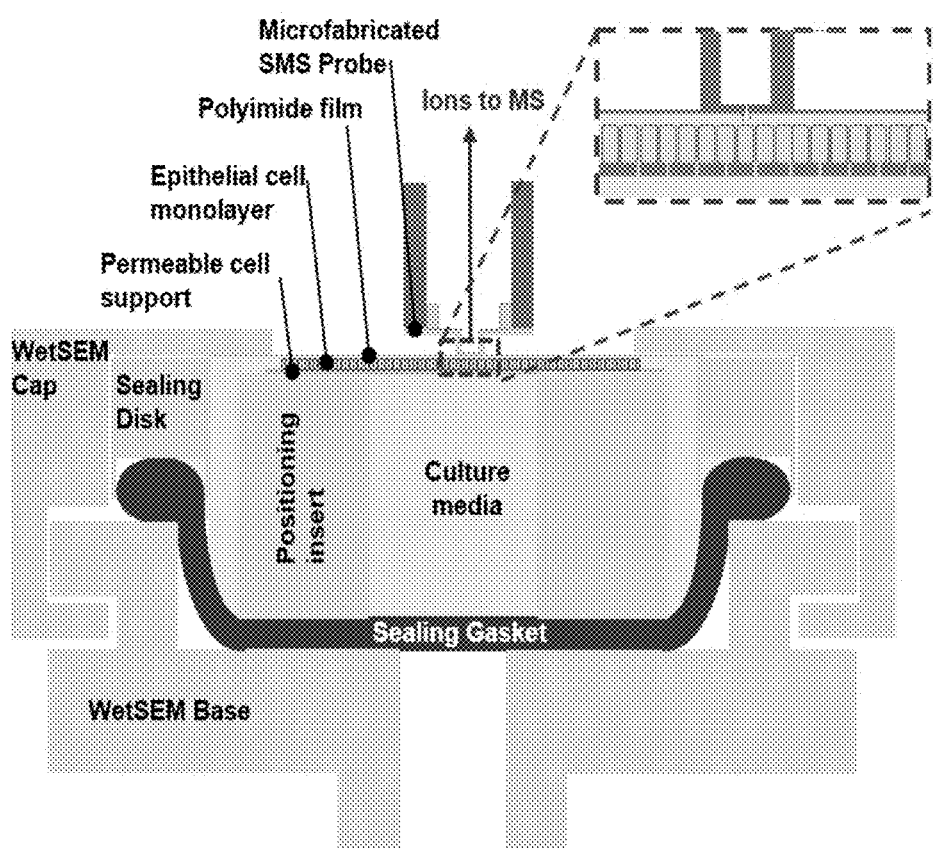
FIG. 10 illustrates a schematic of a cross section of a WetSEM capsule used for SMS imaging experiment. The culture media in the capsule is maintained at or near the atmospheric pressure and desired temperature. The microfabricated SMS probe penetrates the polyimide cover film of the WetSEM capsule at the location determined via SEM imaging of the object inside the capsule (for example, an object is the epithelial cell monolayer on a polycarbonate permeable support membrane).
Figure 11A:
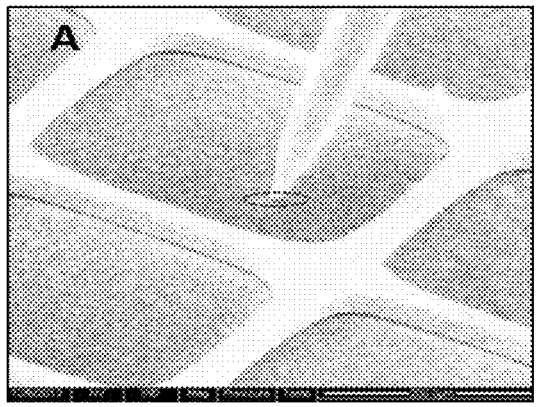
FIG. 11(A) illustrates a SEM image showing the SMS probe pulled glass capillary tip penetrating the polyimide membrane of a water filled WetSEM capsule.
Figure 11B:
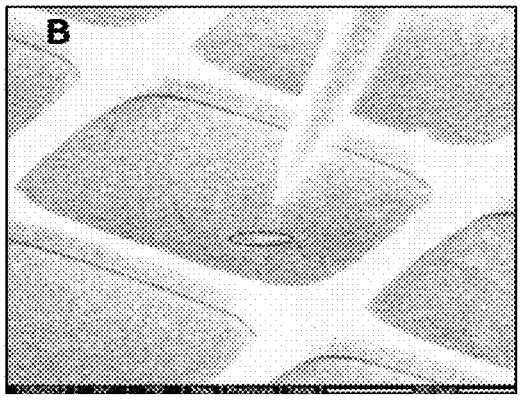
FIG. 11(B) illustrates that upon removal the penetration site (dashed red oval) is sealed with an ice plug.
Figure 11C:
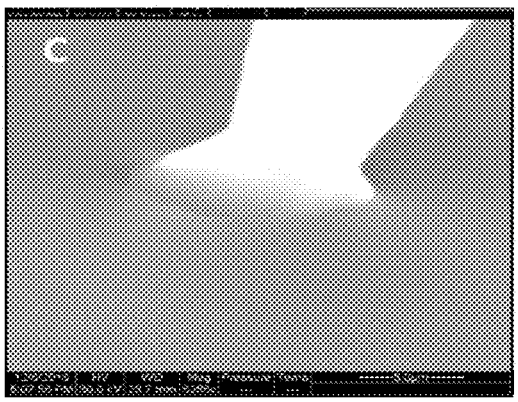
FIG. 11(C) illustrates the penetration sites up to 5 µm in diameter self-seal and the WetSEM capsule membrane retains integrity. Here the seal is locally nucleated ice.
Figure 11D:
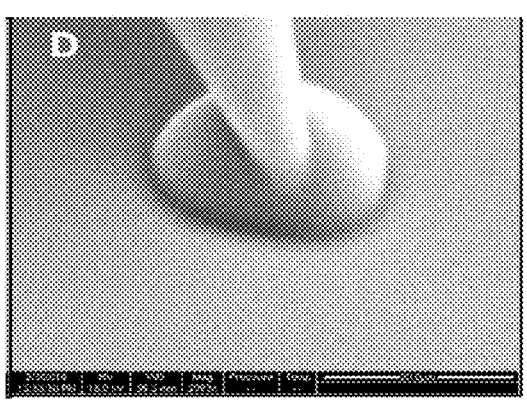
FIG. 11(D) illustrates the slight gas pressurization of the glass capillary provides enough thermal energy to keep the fluid past the capillary/membrane edge in liquid form, and capillary forces limit the leakage rate.

Embodiments of the present disclosure include the use of sealed compartments such as WetSEM® cells. In this way, imaging of fully hydrated objects can be conducted at atmospheric pressure in a scanning electron microscope (SEM), because objects are imaged in sealed specimen capsules, separated from the evacuated interior of the electron microscope by a thin, electron-transparent partition membrane that is strong enough to sustain a 1-atm pressure difference. This removes the temperature constraints imposed by the ESEM mode of operation of the SMS probe imaging system. Furthermore, cells can be grown directly in the capsules or small pieces of permeable support containing cells can be placed in the WetSEM® chamber. The SMS sampling probe can be inserted through the WetSEM® cell polyimide membrane to access the extracellular microenvironment, and the interior of the cells (FIG. 10).

Controlled SMS probe sampling tip penetration into the WetSEM® capsules has been demonstrated with subsequent resealing of the puncture site, which allows for sampling from native biological materials under normal physiologic conditions (FIG. 11). This was a concern because one had to ensure catastrophic failure of the capsule does not occur. It has been demonstrated that a controlled introduction of a pulled glass capillary tip within the SEM has the ability to penetrate the polyimide membrane without failure of the membrane. The punctures were less than about 5 µm in diameter, and the membrane retains structural integrity, and the puncture edge self-seals, either with ice or liquid water, where the state of the seal depends upon capillary temperature. When the capillary is withdrawn, the puncture completely reseals with locally nucleated ice. Multiple punctures have been successfully performed using the same capillary/WetSEM® capsule in the course of a continuous experiment.

Example 6

With sufficiently high spatial resolution of the SMS probe imaging in ESEM environment, it should be possible to sample from specific areas of the plasma membrane. Thus, application of SMS probe in ESEM mode would be particularly useful for differentiating the charged lipids in lipid rafts from the poorly charged lipids in other areas of the membrane.

Having sampled from the extracellular, the near membrane, and the membrane environment, one can move the SMS probe into the cytosol near the inner surface of the membrane and then further into the cell. Approaches have already been demonstrated for drug delivery to cells in microfluidic devices and many design features and fabrication methods of these devices can be adopted here—except the purpose now would be not to eject molecules into the cell, but to extract the local content followed by its electrospray ionization, just like in a standard operating mode of the ESEM-SMS probe. This intra-cellular mode of the ESEM-SMS imaging requires optimization to minimize mechanical stresses on the cell membrane associated with the SMS probe piercing of the membrane, and managing the osmotic stress associated with extraction of specific molecules/ions/cytosol from the cell.

Example 7

Figure 14B:
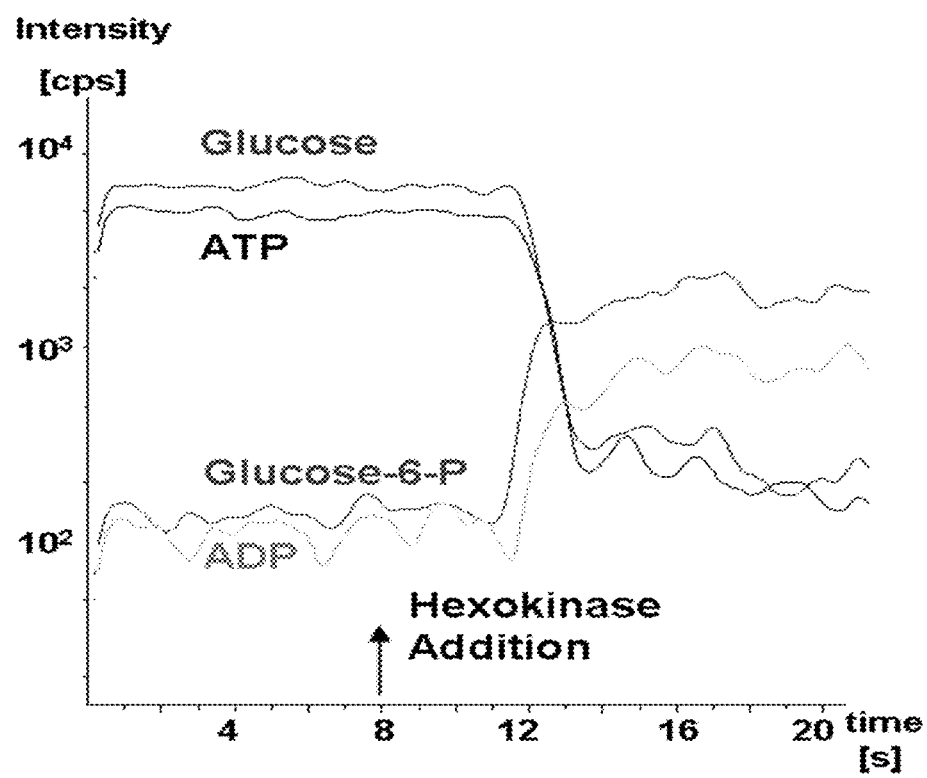
FIG. 14B illustrates an application of the SMS probe for real time monitoring of a transient enzyme catalyzed reaction. Yeast hexokinase, added at time 8 s to a solution of 1 mM ATPMg, 1 mM glucose, and 50 mM ammonium bicarbonate in DI water catalyzes the transfer of a phosphate group from ATP to glucose, yielding glucose-6-phosphate and ADP. The reaction kinetics are visible to a temporal resolution of ~2 seconds.
Figure 14C:
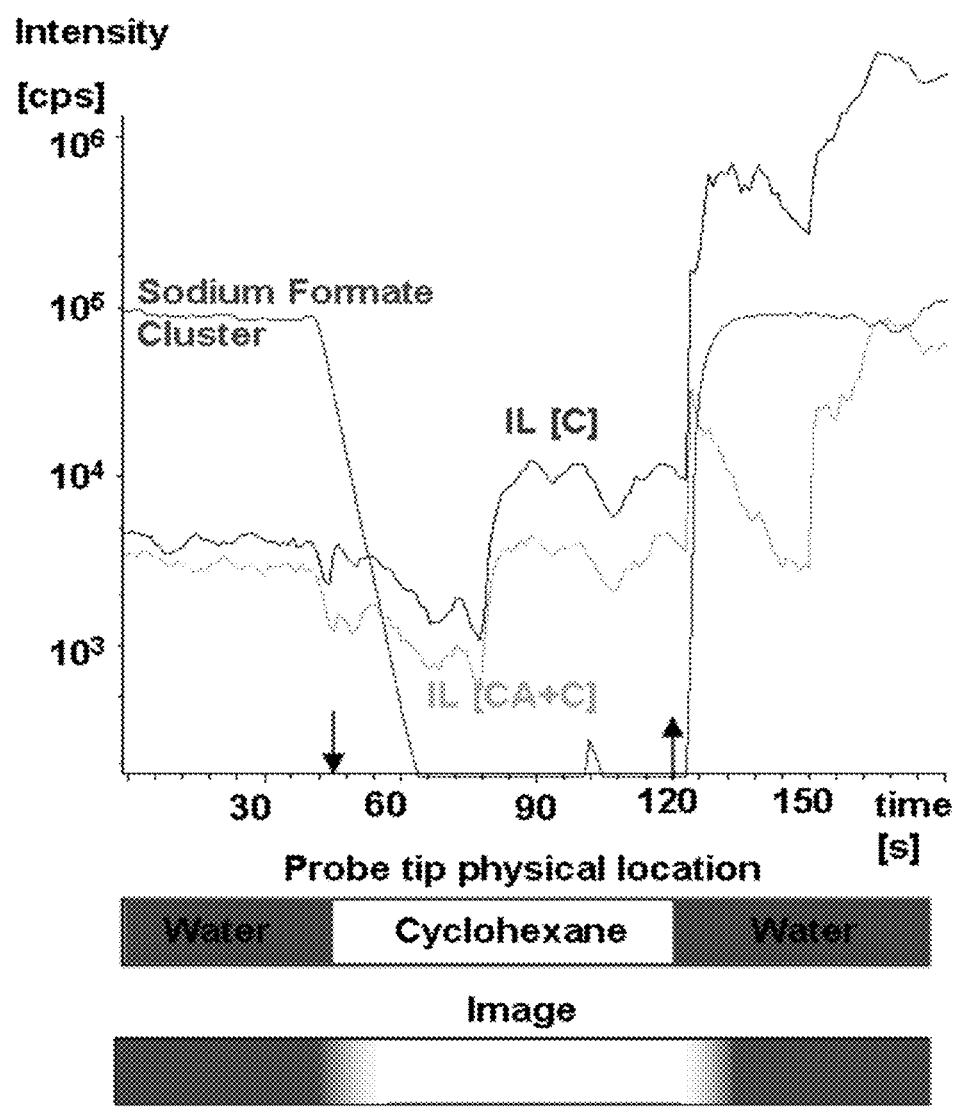
FIG. 14C illustrates an application of the SMS probe to image a spatially heterogeneous liquid sample of two immiscible liquids, water and cyclohexane. Initially the probe tip is in a solution of 0.1% formic acid and 500 mg/mL sodium formate in water. At time=45 seconds the stage is moved at 1 mm/s for 1 second to cause the tip to traverse across the meniscus between the aqueous solution and a solution of 50 µM ionic liquid in cyclohexane. At time=120 seconds the stage motion is repeated in reverse, moving the tip back into the aqueous solution.

An embodiment of the SMS probe demonstrated combined passive sampling from a confined liquid volume with a nano-electrospray, and subsequent gas phase ion transport to the MS inlet. Demonstrated capabilities of the first generation device include peptide and protein identification (reserpine, cytochrome-c, etc.), detection of chemical transients with about 1 sec temporal resolution, and monitoring of an enzyme catalyzed chemical reaction (FIG. 14). These capabilities are unique, have already considerably advanced the current state-of-the-art in the field of imaging mass spectrometry, and validate the basic ideas of the SMS probe concept. The spatial resolution, defined by the sampling capillary inlet diameter, of the first generation device was ~10 µm. Salt removal via in-line microdialysis was demonstrated in an embodiment of the SMS probe, using a hollow cellulose fiber carrying the sample through a counterflow mass exchanger integrated between the SMS sampling capillary and its ESI tip. In-line microdialysis was shown for conditioning of ambient cell culture samples enabling detection of peptides via nano-ESI-MS; but, as expected, the required dialysis time in this conventional "macro"-fabricated version of the device presented a significant degradation of temporal resolution (See. Olivero, D., M. LaPlaca, and P. A. Kottke, *Ambient Nanoelectrospray Ionization with In-Line Microdialysis for Spatially Resolved Transient Biochemical Monitoring within Cell Culture Environments*. Analytical Chemistry, 2012. 84 (4): p. 2072-2075, which is incorporated by reference). Microfabrication and monolithic integration present a straight-forward path for managing this challenge and minimizing the negative impact of any in-line sample processing on the overall temporal resolution of sampling, and has been demonstrated to improve the time response by two orders of magnitude approaching the sub-second time resolution (See, Tibavinsky, I., *A microfabricated rapid desalting device for integration with electropraying tip*, Masters Thesis, *Mechanical Engineering*. 2014, Georgia Institute of Technology: Atlanta Ga., which is incorporated by reference).

SMS Probe Geometry, Functional and Operational Description.

Figure 12:
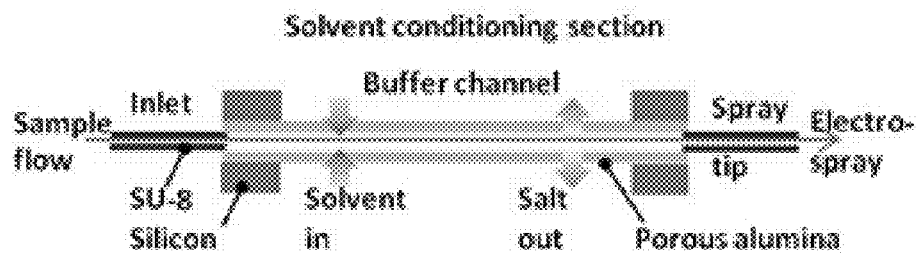
FIG. 12 illustrates a cross section of the microfabricated SMS probe with integrated solvent conditioning section. All required microfabrication steps and methods have been demonstrated (e.g., FIG. 9C).
Figure 13:
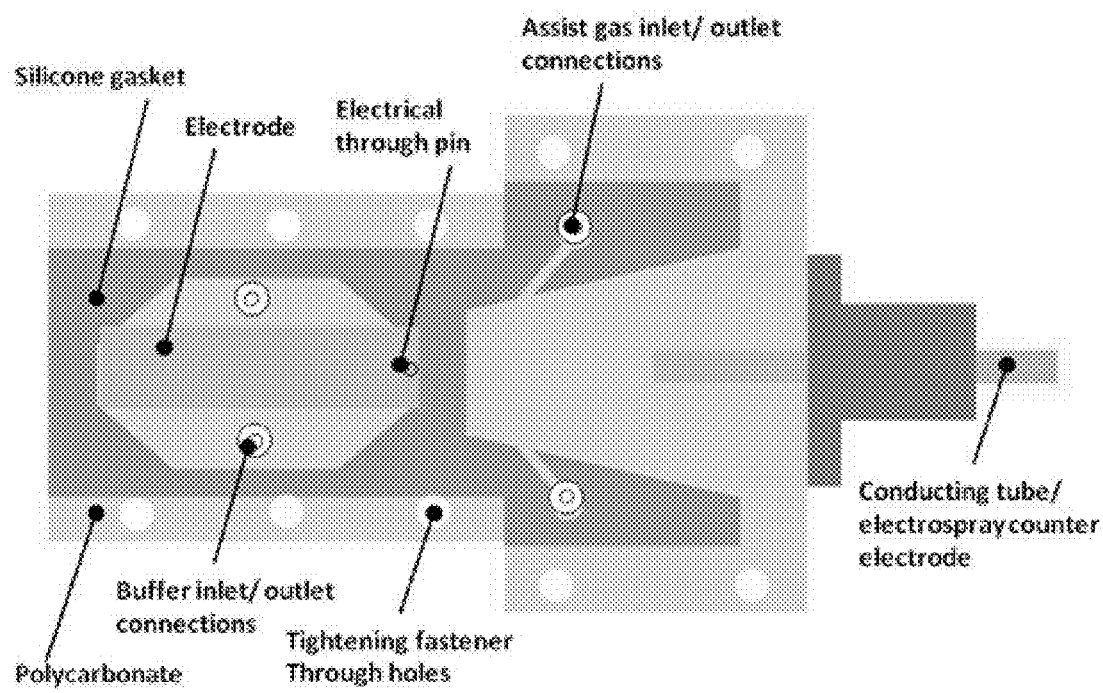
FIG. 13 illustrates a schematic of an embodiment of the SMS probe package which includes the sample conditioning section. The microfabricated device, FIG. 12, which has porous alumina membranes on the top and bottom of the sampling channel, is sandwiched between silicone gaskets (one on top and one below) that seal the package. The microdialysis buffer fluid enters through two inlet lines and exits through two identical ports. Charged electrodes (optional) amplify salt removal from the sample. Nitrogen assist gas promotes continuous spray and provides control of pressure for electrospray independent of ESEM chamber pressure.

A liquid sample passively aspirated by the SMS probe capillary (FIG. 14A can be subject to in-line conditioning, which includes salt removal, solvent exchange, and/or digestion enhancement through localized electric (resistive) heating of the capillary, prior to gas assisted nano-electrospray ionization, gas phase ion collection and transport from the ESEM chamber to the mass spectrometer inlet (FIG. 12). The SMS probe can include optional monolithically integrated, microfabricated components, including intake/sampling tip (inlet), solvent conditioning section, and electrospray nozzle, i.e., spray tip (FIG. 13), which are packaged to enable (microdialysis buffer delivery, electrospray assist gas, electrical connections for dialysis enhancement and electrospray, and finally connection to conductive tubing for gas phase ion transport to the mass spectrometer (FIG. 13). The inlet is an SU-8 micro-capillary of square cross section (5 µm by 5 µm) that can be fabricated with lengths extending from tens to a hundred microns to several millimeters based on desired depth of probe insertion into sample. The inlet cross-section size defines the lower limit of lateral spatial resolution of the device. In the solvent conditioning (microdialysis) section the sample flows within a microgap lithographically defined in SU-8 photoresist between opposing nano-porous alumina (PA) walls, which enable solvent exchange through diffusion, and salt removal via electro-kinetically enhanced diffusion/migration, while minimizing the hydraulic communication between the sample and conditioning buffer flow streams on the other sides of PA walls. The dialysis channel length can be made as desired from sub-millimeter to several centimeters within the same small package footprint using a serpentine channel design, and the flow rate can be independently adjusted through variation of channel width. The electrospray nozzle is identical to the intake/sampling capillary in fabrication and appearance.

The package, laser machined out of polycarbonate with silicone gaskets to direct fluidic flows (buffer and assist gas) contains the electro-kinetic desalting electrodes, which serve the additional purpose of applying the electrospray voltage to the sample stream, as well as the electrospray counter-electrode and connection to ion transport tubing. The package also contains connections for nitrogen (assist gas) which promotes stable electrospray and reduces ion cloud expansion, which would otherwise result in undesirable losses. The package is attached to the nano-positioning stage in the ESEM chamber and positioning, gas flow, buffer solvent flow, dialysis augmenting electrodes, and voltages applied to the electrospray electrodes are controlled with external software.

ESEM Operation and Reagent Introduction.

The SMS-ESEM probe can be realized on the basis of Quanta 250 FEG (field emission gun) Scanning Electron Microscope capable of Environmental (ESEM) mode of operation. ESEM is made possible though incorporation of dual chambers: a high vacuum domain for passing the high energy electron beam with minimal scattering (to maintain ~50-100 nm spatial resolution of imaging) and a low vacuum domain (small in size to minimize the beam scattering) where the solvent vapors (often water-based for biological application, but modified to achieve a desired composition) are introduced via one or more gas delivery line(s) with individually controlled ejector micro-nozzles. The vapor is then condensed on the sample using localized cooling of substrate and/or nozzle(s) by integrated thermoelectric coolers (FIG. 2).

TABLE I

Representative Solvent Saturation Conditions at 5 to10 Torr in Low Vacuum ESEM

Chamber

| Solvent | $T_{sat}$ ° C. |
|---|---|
| Water | 1 to 11 |
| Methanol | −25 to −16 |
| Chloroform | −40 to −35 |
| Acetonitrile | −27 to −15 |
| Formic Acid | −5 to 0 |

For the solvents, the degree of sub-cooling required for vapor condensation and liquid droplet formation is determined by the saturation temperature at the ~5-10 Torr typical pressure in the low-vacuum ESEM chamber, and these are given in Table I for some relevant substances. The liquid solvent droplet size can be controlled by adjusting the injection flow rate, injection nozzle placement, and nozzle and substrate temperature, which combine to determine the condensation rate on a given substrate. For controlled SMS-ESEM operation, the condensation rate must exceed the removal rate (combined evaporation rate and probe sampling rate) for droplet growth, or be below the combined removal rate to reduce droplet size. Once a condensed phase is formed, droplet composition can be altered through condensation of additional solvents, as well as direct microinjection of liquid phase solvents into the pool. Parallel gas injection system (e.g., Xidex, Inc.) with XYZ positioners (for both microinjection capillaries and the SMS probe) can be used with the ESEM chamber to enable precise solvent deposition and sampling. This system is adopted for ESEM use and controlled using Labview based software, which enables full customization, including individually controlled flow metering valves for each of the four nozzles to permit precise control of volumes of dispensed solvent doses. Individually addressable thermoelectric coolers (e.g., Micropelt) can be affixed to the injection nozzles via thermal paste to enable variable sub-cooling of different component vapors prior to injection. Once a droplet has been created, it can be a site for further vapor condensation, additional direct liquid injection, or SMS probe aspiration. An alternative approach to droplet deposition is maintenance of a thin microlayer above tissue sample through stage-integrated cooling of the entire sample to below the saturation temperature for the bulk vapor component; this approach is particularly useful if measurements of secreted molecules from live cells are desired.

Temporal and Spatial Resolution.

The intrinsic temporal resolution of the probe is the residence time, determined by the sample flow rate (1-5 nL/s) and total probe volume (lithographically adjusted from 0.25 nL to 12 nL) to be from 50 msec to 12 sec. Further reduction in sampling time (improving temporal resolution) can be achieved via a transient-pulse ESI mode of SMS probe operation. Residence time can be adjusted depending upon in-line conditioning requirements (heating, digestion, solvent modification, and salt removal) and desired temporal resolution for a given experiment. Salt removal, which is promoted by reduced dialysis membrane separation distance, $L_s$, can be enhanced as needed for fast residence times, via control of cross channel electric field intensity, E. The required residence time for salt removal with electrokinetic enhancement scales as $kTL_s/(DzeE)$ where k is Boltzmann's constant, T is sample temperature, z is ion valence number, D is the binary mass diffusion coefficient, and e is the elementary charge, and theoretical predictions indicate that in the microfabricated device ~300 mmol salt content can be removed in 50 msec with application of ~100 V/m cross channel electric field.

For instrument application with probes designed for sub-second acquisition, resolution can be limited by the mass spectrometer response time (e.g., ~500 msec for an Orbitrap instrument). To achieve an increased apparent temporal resolution, one can exploit thermal control to slow down the chemical processes. For most biological systems, the $Q_{10}$ value, which quantifies the impact of temperature change on the rate of biological processes, i.e., $Q_{10}=(rate_2/rate_1)^{10/(T_2-T_1)}$, is two to three. In the ESEM, temperature is a function of solvent, as described in Table I, and therefore a range of achievable temporal resolutions is significantly extended. For membrane chemistries, using chloroform as solvent, the enhancement of temporal resolution could be ~1000×. For cytoplasmic chemistries, using water at 1° C., we expect to reduce the rate of enzyme reactions by ~10×. These two bounds yield an expected improvement of combined instrument resolution to a range of 0.5 msec to 50 msec.

There is a convolution of spatial and temporal resolution in determination of resolvable time scales of stochastic events, which highlights the value of the SMS imaging spatial resolution in characterization of rapid cellular processes. Spatial resolution is tied to instrument sensitivity and chemical abundance through the ability to solubilize and ionize. Therefore, application of the probe to detect chemistry on the single cell level is possible when the abundance of a given chemical species is sufficiently high within a single cell, i.e., $~10^7-10^8$ molecules, and the chemical species is sufficiently amenable to solubilization and ionization. Expected examples are phospholipids, cyclic-AMP (cAMP), ATP, sugars. Other species, such as proteins, DNA fragments, or low abundance peptides, will require extraction from multiple cells. Based on the sample culture sizes (12 mm disks), there are $~10^6$ cells per sample, providing sufficient sample for detection of even very low abundance chemicals.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and subrange is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

What is claimed is:

1. A method, comprising:
   imaging an object in a system to produce an object image;
   positioning an SMS probe and the object relative to one another at a first position using the object image;
   extracting a sample in the first position using the SMS probe,
   wherein the sample includes one or more components;
   and ionizing one or more of the components,
   wherein imaging is conducted using a scanning electron microscopy system;
   the method further comprising: forming a pool of a liquid on the object;
   wherein positioning includes positioning the SMS probe and the pool relative to one another,
   and wherein extracting includes extracting the sample from: the pool around the object, the surface of the object, within the object, or a combination thereof.

2. The method of claim 1, further comprising analyzing the components of the sample, wherein analyzing includes analyzing the components sample using a mass spectrometer system.

3. The method of claim 1, further comprising a low vacuum chamber surrounding the object and the SMS probe, wherein the pressure in the low vacuum chamber is about 5 to 10 torr, wherein the temperature inside the low vacuum chamber is about −40° C. to 11° C.

4. The method of claim 1, wherein the object is in a sealed compartment, wherein the pressure in the sealed compartment is about 0.1 to 2 atm, and wherein the temperature inside the sealed compartment is about 20° C. to 40° C.

5. The method of claim 1, further comprising conditioning the sample, wherein conditioning includes at least one of the following: dissolving the sample, ionizing the sample, desalting the sample, performing a buffer exchange on the sample, or fragmentation of the sample.

6. The method of claim 1, wherein the pool has a lateral dimension of about 10 to 100 μm.

7. The method of claim 1, wherein sub-cellular level resolution of about 100 nm to 1 μm is achieved and temporal resolution of about 1 ms to 100 ms is achieved.

8. The method of claim 1, further comprising: delivering a solvent or agent to the object.

9. The method of claim 8, wherein delivering includes a delivering system selected from the group consisting of: nozzle liquid injection system, nozzle vapor injection system, stage-integrated vapor/liquid/solid injection, and mechanical manipulators.

10. The method of claim 9, further comprising:
    forming a second pool of a liquid on the object;
    positioning the SMS probe and the second position relative to one another;
    extracting a sample from the second pool using the SMS probe, wherein the sample includes one or more components; and
    ionizing one or more of the components.

11. The method of claim 1, further comprising a sealed compartment having a thin film disposed over a compartment, wherein the compartment includes the object and a pool of liquid on the object, wherein positioning includes contacting the SMS probe with the thin film so that the SMS probe penetrates the thin film, and wherein extracting includes extracting a sample from the pool using the SMS probe.

12. The method of claim 11, wherein extracting includes extracting from: the fluid around the object, the surface of the object, within the object, or a combination thereof.

13. The method of claim 12, further comprising:
    positioning the SMS probe at a second position of the structure with the thin firm located at the second position so that the SMS probe penetrates the thin film; extracting a sample from the second position using the SMS probe wherein the sample includes one or more components; and
    ionizing one or more of the components.

14. A system comprising:
    a scanning electron microscopy system for imaging an object to form an object image,
    a SMS probe to extract and ionize a sample from the object, and
    a stage,
    wherein the object is disposed on the stage,
        wherein the system is configured to form a pool of liquid on the object;
        wherein the SMS probe, the stage, or a combination thereof are configured to be positioned such that the SMS probe and the pool are relative to one another using the object image so that the SMS probe is able to obtain a sample from the object, and
        wherein the SMS probe is configured to obtain the sample from: the pool around the object, the surface of the object, within the object, or a combination thereof.

15. The system of claim 14, further comprising a computer system to collect data that is used to form the object image.

16. The system of claim 15, wherein the data is selected from the group consisting of: each position of the SMS probe and the object relative to one another, a chemical analysis of the sample at each position, and a combination thereof.

17. The system of claim 14, wherein the SMS probe includes an intake tip, wherein the intake tip includes an opening that is used to obtain the sample of the object.

18. The system of claim 17, wherein the opening of the intake tip has an inner diameter of about 100 nm to 5 μm.

19. The system of claim 14, wherein the stage is a cooled/heated stage selected from integrated thermoelectric device, a liquid cooled/heated stage, a phase-change thermal energy storage material (PCM) stage, and stage having integrated resistance heaters.

20. The system of claim 14, further comprising a mass spectrometry system interfaced with the SMS probe.

21. The system of claim 14, further comprising: a pool forming system used to form a pool of a liquid on the object.

22. The system of claim 14, further comprising: a solvent/agent delivery system used to deliver a solvent or agent to the droplet.

23. The system of claim 22, wherein the solvent/agent delivery system is selected from the group consisting of: nozzle liquid injection system, nozzle vapor injection system, and liquid/vapor injection through a valve-controlled opening within the stage supporting an object being analyzed.

* * * * *